United States Patent
Kubota

(10) Patent No.: US 7,842,576 B2
(45) Date of Patent: Nov. 30, 2010

(54) SEMICONDUCTOR DEVICE INCLUDING FIRST AND SECOND SIDEWALLS AND METHOD OF MANUFACTURING SEMICONDUCTOR DEVICE

(75) Inventor: Yoshitaka Kubota, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/588,931

(22) Filed: Nov. 3, 2009

(65) Prior Publication Data
US 2010/0112770 A1    May 6, 2010

(30) Foreign Application Priority Data
Nov. 6, 2008    (JP) ............... 2008-285001

(51) Int. Cl.
H01L 21/336    (2006.01)
(52) U.S. Cl. ............... 438/283; 438/303; 257/E21.173; 257/E21.34
(58) Field of Classification Search ................. 438/284, 438/285, 282, 286, 283, 303; 257/E21.173, 257/E21.34, E21.345, E21.454, E29.041, 257/E29.127
See application file for complete search history.

(56) References Cited

U.S. PATENT DOCUMENTS

| | | | | | |
|---|---|---|---|---|---|
| 4,343,015 | A * | 8/1982 | Baliga et al. | ............... | 257/267 |
| 5,112,766 | A * | 5/1992 | Fujii et al. | ............... | 438/179 |
| 5,834,802 | A * | 11/1998 | Takahashi et al. | ............. | 257/280 |
| 5,874,330 | A * | 2/1999 | Ahn | ............... | 438/230 |
| 6,200,864 | B1 * | 3/2001 | Selcuk | ............... | 438/286 |
| 6,261,910 | B1 * | 7/2001 | Ahn et al. | ............... | 438/299 |
| 6,492,694 | B2 * | 12/2002 | Noble et al. | ............... | 257/410 |
| 6,531,359 | B1 * | 3/2003 | Tempel et al. | ............... | 438/257 |
| 6,573,169 | B2 * | 6/2003 | Noble et al. | ............... | 438/592 |
| 6,909,147 | B2 * | 6/2005 | Aller et al. | ............... | 257/347 |
| 6,943,077 | B2 * | 9/2005 | Liu et al. | ............... | 438/230 |
| 7,060,580 | B2 * | 6/2006 | Cho et al. | ............... | 438/303 |
| 7,101,763 | B1 * | 9/2006 | Anderson et al. | ............... | 438/285 |
| 7,151,706 | B2 | 12/2006 | Nakamura | | |
| 7,235,441 | B2 * | 6/2007 | Yasui et al. | ............... | 438/257 |
| 7,248,507 | B2 | 7/2007 | Nakamura | | |
| 7,396,713 | B2 * | 7/2008 | Yang | ............... | 438/197 |
| 7,422,949 | B2 * | 9/2008 | Yu et al. | ............... | 438/299 |
| 7,432,165 | B2 * | 10/2008 | Fukuzaki et al. | ............... | 438/286 |

(Continued)

FOREIGN PATENT DOCUMENTS

JP    2005-353106 A    12/2005

(Continued)

*Primary Examiner*—Walter L Lindsay, Jr.
(74) *Attorney, Agent, or Firm*—McGinn IP Law Group, PLLC

(57) ABSTRACT

The invention provides a method of manufacturing a semiconductor device including a non-volatile memory with high yield, and a semiconductor device manufactured by the method. A method of manufacturing a semiconductor device includes a process of forming a second side wall such that the width of the second side wall, which is formed on the side of a portion of a second gate electrode that does not face dummy gates on a drain forming region side, in a gate length direction is larger than that of the second side wall, which is formed on the side of the second gate electrode on a source forming region side, in the gate length direction, in a non-volatile memory forming region.

5 Claims, 8 Drawing Sheets

U.S. PATENT DOCUMENTS

| | | |
|---|---|---|
| 2002/0014672 A1* | 2/2002 | Noble et al. ................. 257/413 |
| 2004/0038475 A1* | 2/2004 | Dabral et al. ............... 438/238 |
| 2005/0232009 A1 | 10/2005 | Nakamura |
| 2005/0236677 A1* | 10/2005 | Li et al. ...................... 257/401 |
| 2005/0282320 A1* | 12/2005 | Hasuike ...................... 438/167 |
| 2007/0051977 A1* | 3/2007 | Saito et al. .................. 257/192 |
| 2007/0091663 A1 | 4/2007 | Nakamura |
| 2010/0112770 A1* | 5/2010 | Kubota ....................... 438/283 |

FOREIGN PATENT DOCUMENTS

| | | |
|---|---|---|
| JP | 2006-269586 A | 10/2006 |
| JP | 2007-157183 A | 6/2007 |

* cited by examiner

FIG. 3A
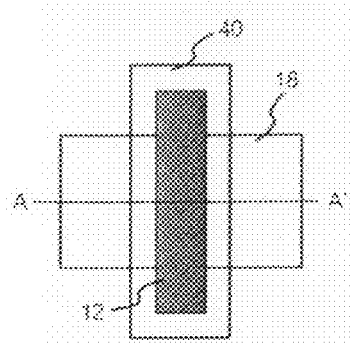
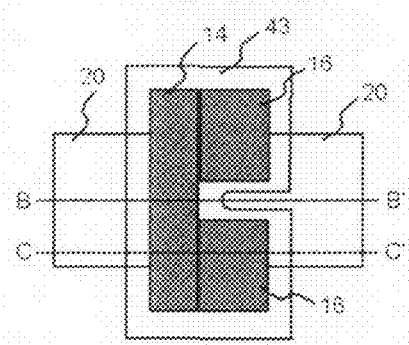
FIG. 3B
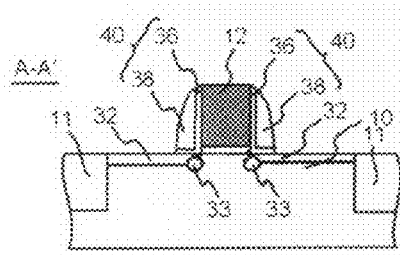
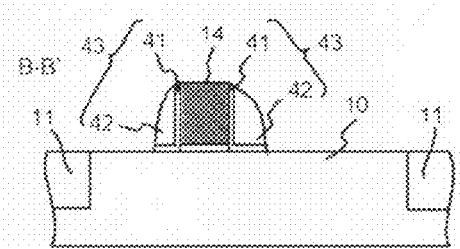
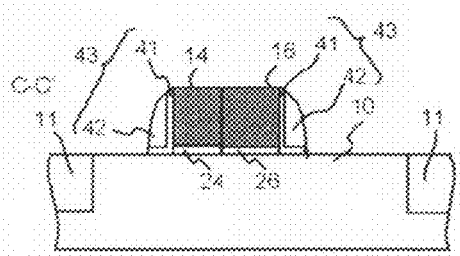

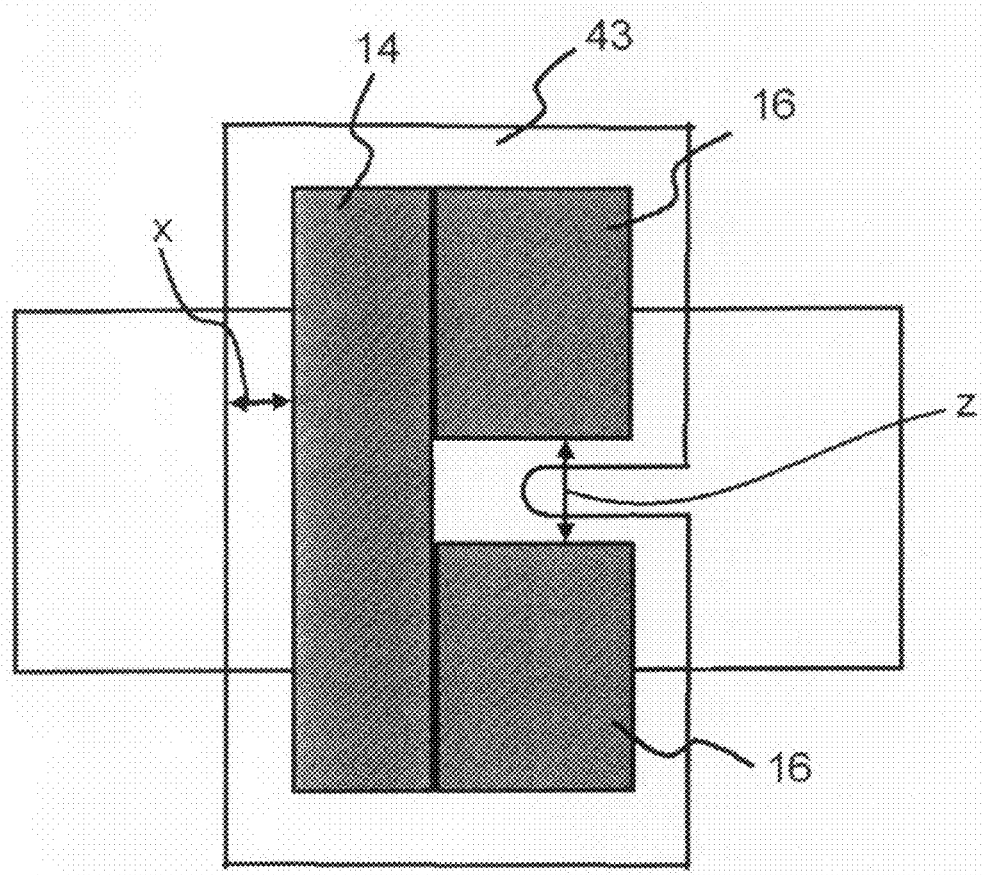

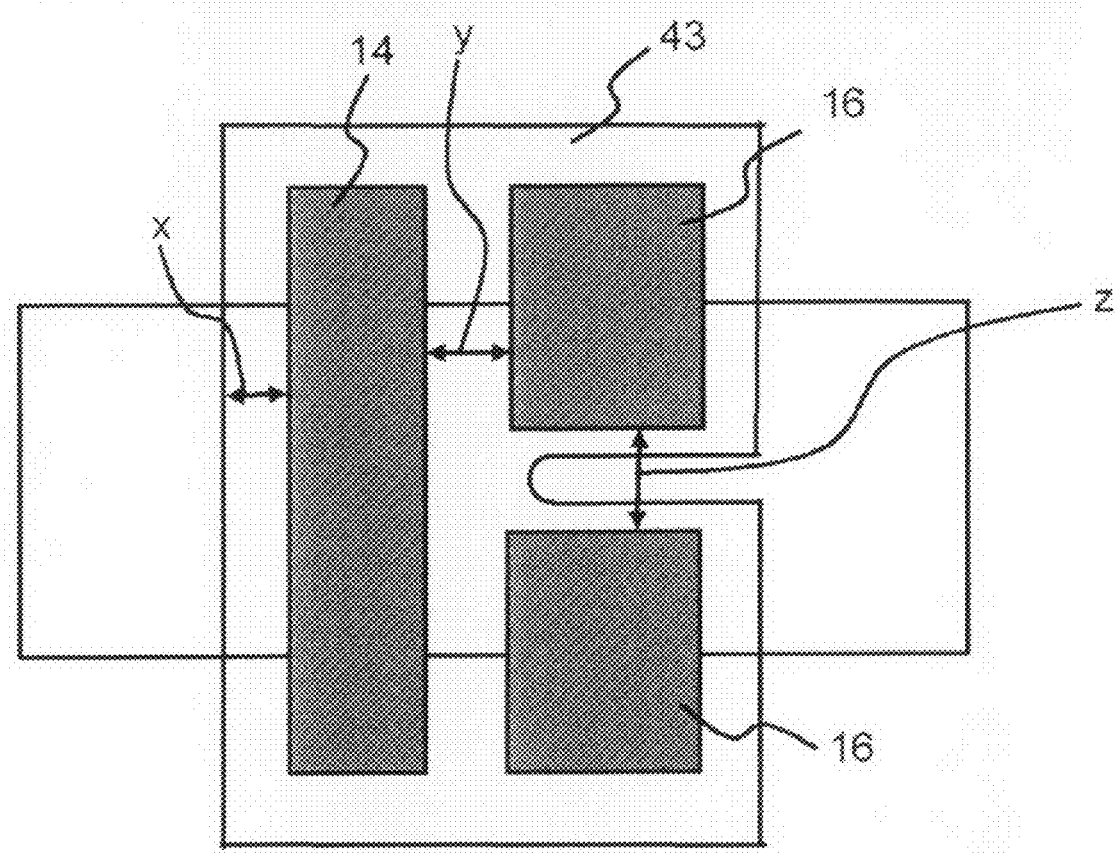

FET FORMING REGION    NON-VOLATILE MEMORY FORMING REGION

FIG. 8A  FET FORMING REGION         NON-VOLATILE MEMORY FORMING REGION
PRIOR ART
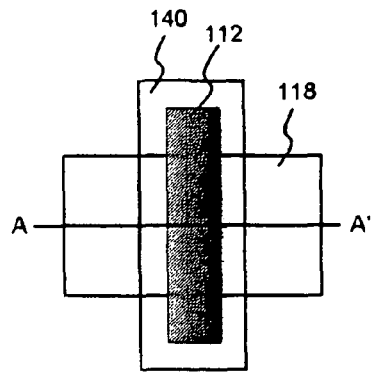 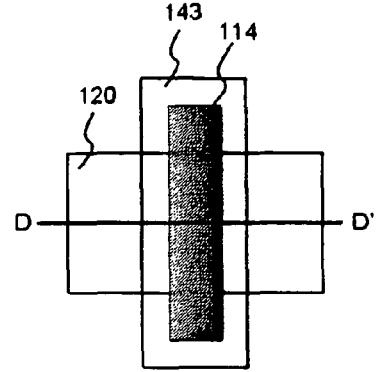
FIG. 8B
PRIOR ART
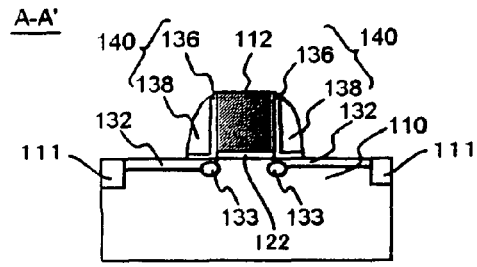 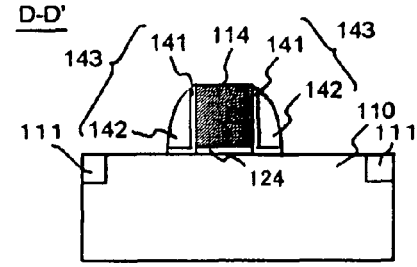
FIG. 9
PRIOR ART  FET FORMING REGION        NON-VOLATILE MEMORY FORMING REGION
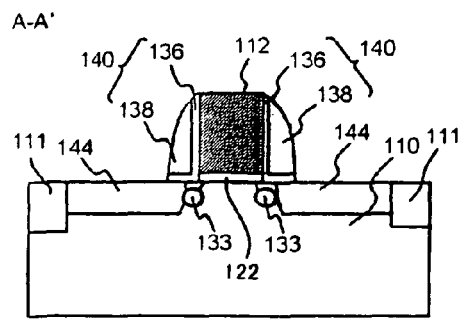 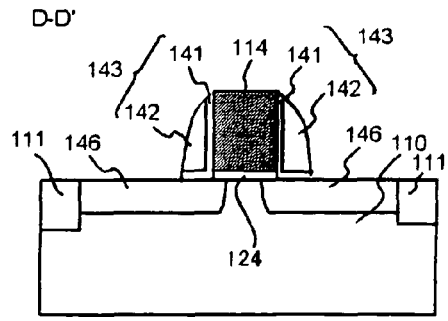

SEMICONDUCTOR DEVICE INCLUDING FIRST AND SECOND SIDEWALLS AND METHOD OF MANUFACTURING SEMICONDUCTOR DEVICE

BACKGROUND

1. Technical Field

The present invention relates to a semiconductor device including an FET and a non-volatile memory, and a method of manufacturing the semiconductor device.

2. Related Art

Japanese Unexamined Patent Publication No. 2006-269586 discloses a semiconductor element having a comb-shape gate electrode.

Japanese Unexamined Patent Publication Nos. 2005-353106 and 2007-157183 disclose a method of forming a non-volatile memory without adding any process to a general logic CMOS forming process by positively deteriorating hot carriers to trap charges below a side wall.

Hereinafter, the problems to be solved by the invention will be described with reference to the accompanying drawings.

As shown in FIGS. 7A and 7B, an FET forming region including a first gate insulating film 122 and a first gate electrode 112 is provided on a first diffusion layer 118 surrounded by an element isolation region 111 on a substrate 110, and a non-volatile memory forming region including a second gate insulating film 124 and a second gate electrode 114 is provided on a second diffusion layer 120 surrounded by the element isolation region 111. FIG. 7A is a top view schematically illustrating the FET forming region and the non-volatile memory forming region of the semiconductor device, and FIG. 7B is cross-sectional views taken along the lines A-A' and D-D'.

Then, a pair of extension regions 132 and pocket regions 133 are formed in the FET forming region of the substrate using the first gate electrode 112 and a resist film formed so as to cover the non-volatile memory forming region as a mask. Then, the resist film formed so as to cover the non-volatile memory forming region is removed.

Then, as shown in FIGS. 8A and 8B, a first side wall 140 is formed on the side wall of the first gate electrode 112, and a second side wall 143 is formed on the side wall of the second gate electrode 114. The first side wall 140 includes a first insulating film 136 and a second insulating film 138. The second side wall 143 includes a first insulating film 141 and a second insulating film 142. FIG. 8A is a top view schematically illustrating the FET forming region and the non-volatile memory forming region of the semiconductor device, and FIG. 8B is cross-sectional views taken along the lines A-A' and D-D'.

Then, impurities are implanted using the first gate electrode 112 and the first side wall 140, and the second gate electrode 114 and the second side wall 143 as a mask. In this way, a pair of first source/drain regions 144 is formed on both sides wall of the first side wall 140 in the vicinity of the surface of the substrate, and a pair of second source/drain regions 146 is formed on both sides of the second side wall 143 in the vicinity of the surface of the substrate.

Then, the impurities in the first source/drain regions 144 and the second source/drain regions 146 are activated by annealing (FIG. 9).

According to this method, since the resist film covers the non-volatile memory forming region, it is difficult to form an extension region and a pocket region in the non-volatile memory forming region. Therefore, in the non-volatile memory forming region, the intensity of an electric field in the horizontal direction is increased, and hot carriers are more likely to be generated. As a result, it is possible to trap charges below the second side wall 143.

However, as shown in FIG. 9, when the extension region is not formed in the non-volatile memory forming region, the ends of the second source/drain regions 146 are not formed immediately below the second side wall 143, but are formed immediately below the second gate electrode 114.

Since the electric field is strongest at the ends of the second source/drain regions 146, the largest amount of hot carrier is generated at the ends. Therefore, when the ends of the second source/drain regions 146 are formed immediately below the second gate electrode 114, many hot electrons are trapped by a gate oxide film, and it is impossible to effectively trap electrons below the second side wall 143.

In recent years, as the size of the semiconductor device has been reduced, the size of the side wall has been significantly reduced.

SUMMARY

The invention has been made in order to solve the above-mentioned problems, and an object of the invention is to provide a semiconductor device including a non-volatile memory in which a second side wall 143 can reliably trap electrons, and a method of manufacturing the semiconductor device without adding any process to a transistor forming process according to the related art.

In one embodiment of the invention, there is provided a method of manufacturing a semiconductor device. The method includes: forming an FET forming region including a first gate electrode and a non-volatile memory forming region including a second gate electrode and a plurality of dummy gates provided in a comb teeth shape on a drain forming region side wall of the second gate electrode over a substrate; forming a resist film that covers the non-volatile memory forming region; implanting impurities into the FET forming region of the substrate, using the resist film and the first gate electrode as a mask, to form a pair of extension regions on both sides of the first gate electrode in the vicinity of the surface of the substrate; removing the resist film and forming an insulating film so as to cover the FET forming region and the non-volatile memory forming region; and etching the insulating film to obtain a first side wall formed over the side wall of the first gate electrode and a second side wall formed over the sides of the second gate electrode and the dummy gates. The step of etching the insulating film contains a step of obtaining the second side wall in which the wide of the second side wall formed over the side wall of the second gate electrode not facing the dummy gates on the drain forming region side is larger, compared to the wide of the second side wall formed over the side wall of the second gate electrode on a source forming region side, in the gate length direction.

In the above-mentioned embodiment of the invention, in the non-volatile memory forming region, a plurality of dummy gates are provided in a comb teeth shape on the drain forming region side of the second gate electrode. The plurality of dummy gates are arranged such that a thick CVD film (insulating film) is formed in the region surrounded by two side walls facing each other of the dummy gates and the side wall of the second gate electrode.

Therefore, in the non-volatile memory forming region, the width of the second side wall of the second gate electrode in the gate length direction on the drain forming region side is larger than that on the source forming region side.

In this way, since the end of the drain region on the drain side can be formed immediately below the side wall, it is possible to reliably trap the hot carriers generated at the end of the drain region below the side wall.

Therefore, it is possible to improve the yield of a semiconductor device including a non-volatile memory that uses the hot carriers trapped by the second side wall and has improved writing characteristics.

In another embodiment of the invention, there is provided a semiconductor device including: an FET region that includes a first gate electrode formed over a substrate, first source/drain regions formed on both sides of the first gate electrode in the vicinity of the surface of the substrate, and a first side wall formed over the side wall of the first gate electrode; and a non-volatile memory region that includes a second gate electrode formed over the substrate, a plurality of dummy gates provided in a comb teeth shape on a drain forming region side of the second gate electrode, second source/drain regions formed on both sides of the second gate electrode in the vicinity of the surface of the substrate, and a second side wall provided over the side wall of the second gate electrode. The width of the second side wall, which is formed over the side wall of a portion of the second gate electrode that does not face the dummy gates on a second drain region side, in the gate length direction is larger than that of the second side wall, which is formed over the side wall of the second gate electrode on the second source region side, in the gate length direction.

In the above-mentioned embodiment of the invention, in the non-volatile memory forming region, the width of the second side wall of the second gate electrode in the gate length direction on the drain forming region side is larger than that on the source forming region side.

In this way, since the end of the drain region on the drain side is formed immediately below the side wall, it is possible to reliably trap the hot carriers generated at the end of the drain region below the side wall.

Therefore, it is possible to improve the yield of a semiconductor device including a non-volatile memory that uses the hot carriers trapped by the side wall and has improved writing characteristics.

According to the above-mentioned embodiments of the invention, it is possible to provide a method of manufacturing a semiconductor device including a non-volatile memory with high yield, and a semiconductor device manufactured by the method.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 3A and 3B are diagrams schematically illustrating the method of manufacturing the semiconductor device according to the first embodiment;

FIG. 5 is a top view schematically illustrating a non-volatile memory forming region in the method of manufacturing the semiconductor device according to the first embodiment;

FIG. 6 is a top view schematically illustrating a non-volatile memory forming region in a method of manufacturing a semiconductor device according to a second embodiment;

FIGS. 8A and 8B are diagrams illustrating a method of manufacturing a semiconductor device for describing the problems to be solved by the invention; and FIG. 9 is a diagram illustrating a method of manufacturing a semiconductor device for describing the problems to be solved by the invention.

DETAILED DESCRIPTION

Figure 1A:
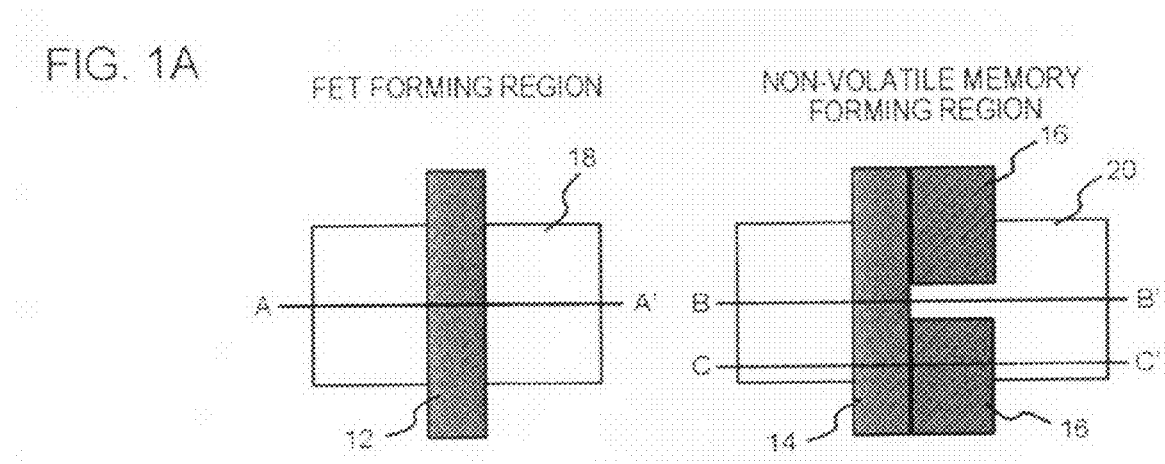
FIGS. 1A and 1B are diagrams schematically illustrating a method of manufacturing a semiconductor device according to a first embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, exemplary embodiments of the invention will be described with reference to the accompanying drawings. In the drawings, the same components are denoted by the same reference numerals, and a description thereof will not be repeated.

First Embodiment

A method of manufacturing a semiconductor device according to an embodiment of the invention includes the following processes.

(a) A process of forming, on a substrate, an FET forming region including a first gate electrode and a non-volatile memory forming region including a second gate electrode and a plurality of dummy gates provided in a comb teeth shape on the drain forming region side of the second gate electrode.

(b) A process of forming a resist film that covers the non-volatile memory forming region.

(c) A process of implanting impurities into the substrate in the FET forming region, using the resist film and the first gate electrode as a mask, to form a pair of extension regions on both sides of the first gate electrode in the vicinity of the surface of the substrate.

(d) A process of removing the resist film and forming an insulating film so as to cover the FET forming region and the non-volatile memory forming region.

(e) A process of etching the insulating film to obtain a first side wall formed on the side wall of the first gate electrode and a second side wall formed on the sides of the second gate electrode and the dummy gates.

(f) A process of implanting impurities, using the first gate electrode and the first side wall, and the second gate electrode, the dummy gates, and the second side wall as a mask, to form a pair of first source/drain regions on both sides of the first side wall in the vicinity of the surface of the substrate, and a pair of second source/drain regions on both sides of the second side wall and the dummy gates in the vicinity of the surface of the substrate.

(g) A process of performing annealing to activate the impurities in the first and second source/drain regions.

Hereinafter, each of the processes will be described.

Figure 1B:
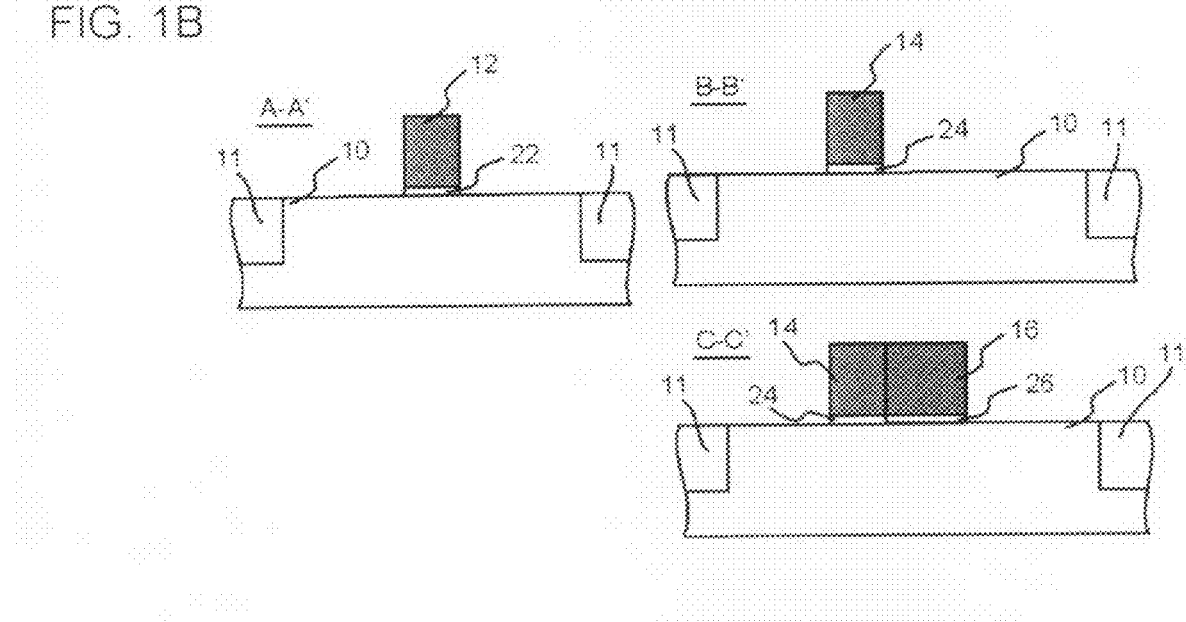

Process (a): an FET forming region including a first gate electrode 12 and a non-volatile memory forming region including a second gate electrode 14 and a plurality of dummy gates 16 provided in a comb teeth shape on the drain forming region side of the second gate electrode 14 are formed over a substrate 10 (FIGS. 1A and 1B).

FIG. 1A is a top view schematically illustrating the FET forming region and the volatile memory forming region of the semiconductor device, and FIG. 1B is cross-sectional views taken along the lines of A-A', B-B', and C-C' of FIG. 1A.

First, in the FET forming region, a first gate insulating film 22 and the first gate electrode 12 are formed on the substrate 10 having a first diffusion layer 18 surrounded by an element isolation region 11 by a general method. In the non-volatile memory forming region, a second gate insulating film 24, the second gate electrode 14, a third gate insulating film 26, and dummy gates 16 are formed on the substrate 10 having a second diffusion layer 20 surrounded by the element isolation region 11 by a general method. The first gate electrode 12, the dummy gates 16, and the second gate electrode 14 may be formed at the same time. Two dummy gates 16 are provided in a comb teeth shape on the drain forming region side of the second gate electrode 14.

The method of manufacturing a semiconductor device according to this embodiment has a large process margin, and can obtain a self-aligned side wall having the desired shape by appropriately selecting, for example, the gap between the dummy gates 16, a material forming the insulating film for the side wall, which will be described below, the thickness of the insulating film, and the etching conditions of the insulating film.

FIG. 5 is a top view schematically illustrating the non-volatile memory forming region according to this embodiment.

In this embodiment, the gate width of the dummy gate 16 is smaller than that of the second gate electrode 14.

In this embodiment, it is preferable that two dummy gates 16 be arranged so as to be spaced from each other with a distance z represented by the following expression therebetween.

Expression: $1.5x < z \leq 2.5x$ x indicates the length of a second side wall 43 formed on side of the region to be formed a source the second gate electrode 14 in the gate length direction.

When the two dummy gates 16 are spaced from each other with the distance z represented by the above-mentioned expression therebetween, a thick CVD film is grown in the region surrounded by a gate wall. Therefore, the width of the second side wall 43 in the gate length direction on the drain side of the second gate electrode 14 is larger than that of the second side wall 43 in the gate length direction on the source side of the second gate electrode 14.

Process (b): a resist film 30 is formed so as to cover the non-volatile memory forming region.

First, a resist film covers the FET forming region and the non-volatile memory forming region. Then, the resist film is patterned such that the FET forming region is opened, thereby forming the resist film 30.

Process (c): impurities are implanted into the substrate 10 of the FET forming region, using the resist film 30 and the first gate electrode 12 as a mask, to form a pair of extension regions 32 on both sides of the first gate electrode 12 in the vicinity of the surface of the substrate 10.

Figure 2A:
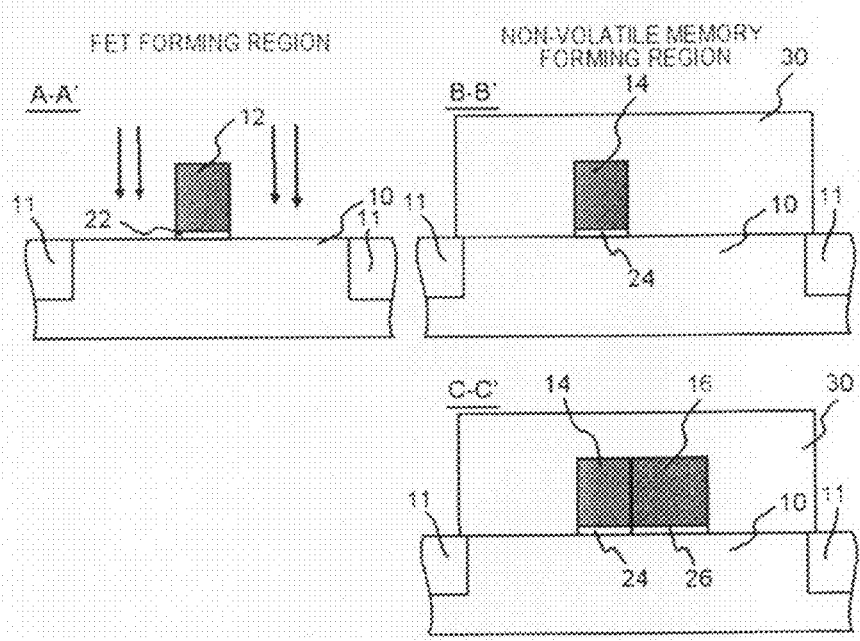
FIGS. 2A and 2B are diagrams schematically illustrating the method of manufacturing the semiconductor device according to the first embodiment.

In this embodiment, as shown in FIG. 2A, impurities, such as arsenic, are implanted into the substrate 10 by a general method (ion implantation) to form the pair of extension regions 32 on both sides of the first gate electrode 12 in the vicinity of the surface of the substrate 10.

Figure 2B:
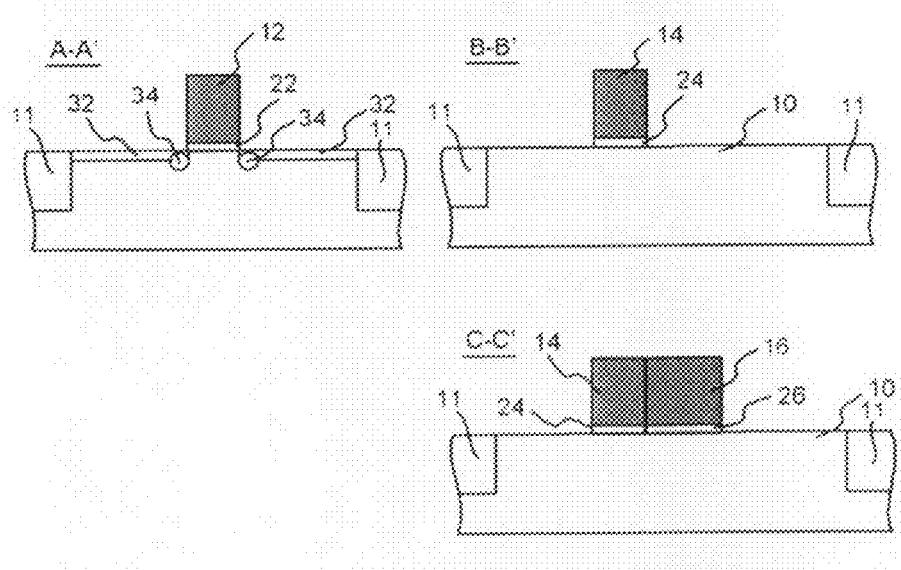

Then, in the FET forming region, for example, $BF_2$ ions are implanted into the substrate 10 by a general method to form a halo layer 34 (FIG. 2B).

Process (d): the resist film 30 is removed, and an insulating film is formed so as to cover the FET forming region and the non-volatile memory forming region.

In this embodiment, first, the resist film 30 is removed, and the first insulating film and the second insulating film are sequentially formed so as to cover the entire surface of the substrate. The first insulating film and the second insulating film may be formed by a CVD method.

Process (e): the insulating film formed in the process (d) is etched to obtain a first side wall 40 formed on the side wall of the first gate electrode 12 and a second side wall 43 formed on the side walls of the second gate electrode 14 and the dummy gates 16 (FIGS. 3A and 3B).

As shown in FIG. 3B, the first side wall 40 includes a first insulating film 36 and a second insulating film 38. In the first side wall 40, the first insulating film 36 has a substantially L shape in a cross-sectional view and the second insulating film 38 has a substantially fin shape in a cross-sectional view.

As shown in FIG. 3B, the second side wall 43 includes a first insulating film 41 and a second insulating film 42. The first insulating film 41 of the second side wall 43 has a substantially L shape in a cross-sectional view. The second insulating film 42 has a substantially fan shape in a cross-sectional view.

In this embodiment, the first insulating film 36 and the first insulating film 41 may be made of SiN, and the second insulating film 38 and the second insulating film 42 may be made of $SiO_2$.

Figure 4A:
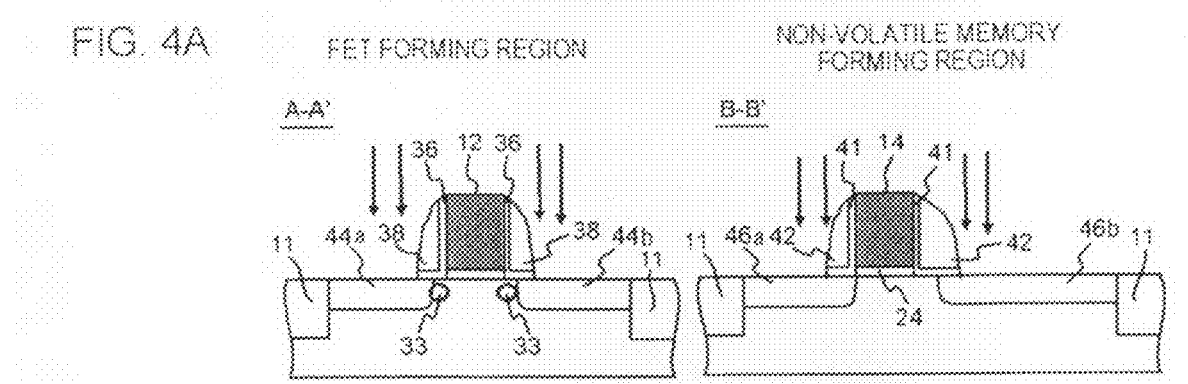
FIGS. 4A and 4B are diagrams schematically illustrating the method of manufacturing the semiconductor device according to the first embodiment.

Process (f): impurities are implanted using the first gate electrode 12 and the first side wall 40, and the second gate electrode 14, the dummy gates 16, and the second side wall 43 as a mask to form a pair of first source/drain regions 44a and 44b on both sides of the first side wall 40 in the vicinity of the surface of the substrate 10 and a pair of second source/drain regions 46a and 46b on both sides of the second side wall 43 and the dummy gates 16 in the vicinity of the surface of the substrate 10, respectively (FIG. 4A).

Figure 4B:
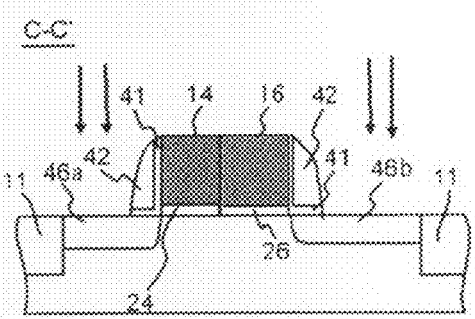
Figure 7A:
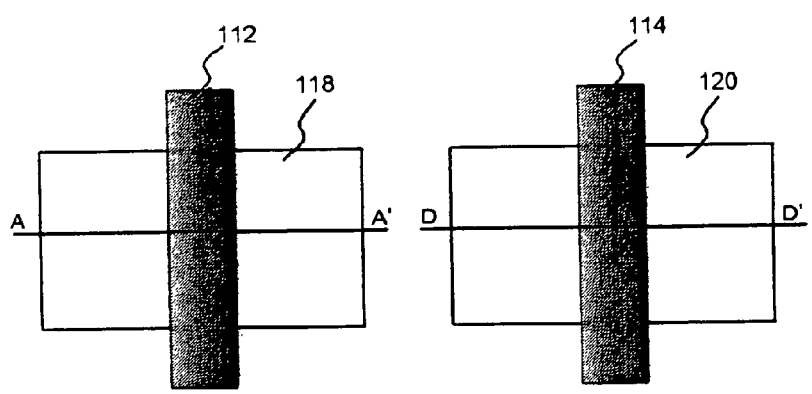
FIGS. 7A and 7B are diagrams illustrating a method of manufacturing a semiconductor device for describing the problems to be solved by the invention.
Figure 7B:
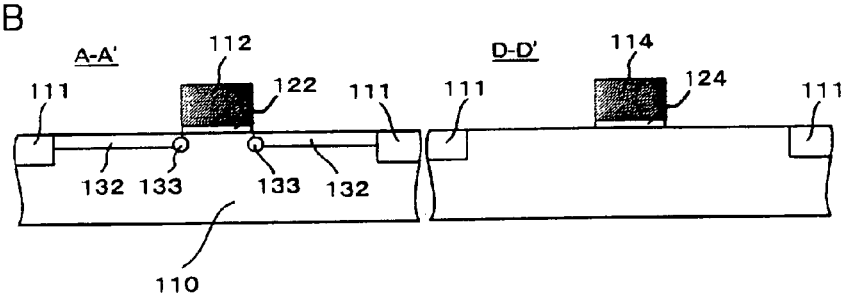

In this embodiment, as shown in FIGS. 4A and 4B, for example, impurities, such as As or P, are implanted to form the first source region 44a and the first drain region 44b on both sides of the first gate electrode 12 in the vicinity of the surface of the substrate 10 and the second source region 46a and the second drain region 46b on both sides of the second gate electrode 14 and the dummy gates 16 in the vicinity of the surface of the substrate 10.

Process (g): the impurities in the first source/drain regions 44a and 44b and the second source/drain regions 46a and 46b are activated by annealing.

Further, the semiconductor device according to this embodiment may be manufactured by a general method.

The semiconductor device including the FET region and the non-volatile memory region shown in FIGS. 4A and 4B can be obtained by the above-mentioned processes.

In the semiconductor device according to this embodiment, the FET region includes the first gate electrode 12 formed on the substrate 10, the first source/drain regions 44a and 44b formed on both sides of the first gate electrode 12 in the vicinity of the surface of the substrate 10, and the first side wall 40 formed on the side wall of the first gate electrode 12.

The non-volatile memory region includes the second gate electrode 14 formed on the substrate 10, a plurality of dummy gates 16 provided in a comb teeth shape on the drain forming region side of the second gate electrode 14, the second source/drain regions 46a and 46b formed on both sides of the second gate electrode 14 in the vicinity of the surface of the substrate 10, and the second side wall 43 provided on the side wall of the second gate electrode 14.

In the non-volatile memory region, the width of the second side wall 43, which is formed on the side wall of a portion of the second gate electrode 14 and does not face the dummy gates 16 on the second drain side, in the gate length direction is larger than that of the second side wall 43, which is formed on the side wall of the second gate electrode 14 on the second source side, in the gate length direction.

Next, the effects of this embodiment will be described.

In the method of manufacturing the semiconductor device according to this embodiment, a plurality of dummy gates 16 is provided in a comb teeth shape on the drain forming region side of the second gate electrode 14. Therefore, it is possible to increase the width of the second side wall 43 formed on the drain forming region side of the second gate electrode 14 in the gate length direction.

In this way, it is possible to form the end of the second drain region 46b immediately below the second side wall 43, as shown in FIGS. 4A and 4B. Therefore, it is possible to reliably trap the hot carriers generated at the end of the second drain region 46b below the second side wall 43.

Therefore, it is possible to improve the yield of a semiconductor device including a non-volatile memory that uses the hot carriers trapped below the second side wall 43 and has improved writing characteristics.

In this embodiment, the second side wall 43 may include a nitride film.

In this case, it is possible to effectively trap the hot carriers. Therefore, it is possible to provide a semiconductor device including a non-volatile memory with more improved writing characteristics.

In the semiconductor device according to this embodiment, in the non-volatile memory forming region, the width of the second side wall 43 of the second gate electrode 14 in the gate length direction on the source forming region side is smaller than that on the drain forming region side.

In this way, since the end of the drain region on the drain side is formed immediately below the side wall, it is possible to reliably trap the hot carriers generated at the end of the drain region below the side wall. Therefore, it is possible to improve the yield of a semiconductor device including a non-volatile memory that uses the hot carriers trapped by the side wall and has improved writing characteristics.

Second Embodiment

In a second embodiment, only components different from those in the first embodiment will be described, and a description of the same components as those in the first embodiment will not be repeated.

In this embodiment, the dummy gates 16 are spaced at a predetermined distance from a drain-region-side surface of the second gate electrode 14.

FIG. 6 is a top view schematically illustrating a non-volatile memory forming region according to this embodiment.

In this embodiment, the dummy gates 16 are provided in parallel to surface of the second gate electrode 14 in the side of a region to be formed drain so as to be spaced therefrom by a distance y represented by the following expression.

Expression: $0 < y \leq 1.5x$ x indicates the length of the second side wall 43 in the gate length direction.

In this embodiment, it is preferable that two dummy gates 16 be arranged so as to be spaced from each other with a distance z represented by the following expression therebetween.

Expression: $1.5x < z \leq 2.5x$ x indicates the length of the second side wall 43 formed on the second gate electrode 14 in side of the region to be formed source in the gate length direction.

When the second gate electrode 14 and the dummy gates 16 are spaced from each other with the distance y represented by the above-mentioned expression therebetween and the dummy gates 16 are spaced from each other with the distance z represented by the above-mentioned expression therebetween, a thick CVD film is grown in the region surrounded by a gate wall. Therefore, the width of the second side wall 43 in the gate length direction on the drain side of the second gate electrode 14 is larger than that of the second side wall 43 in the gate length direction on the source side of the second gate electrode 14.

In a method of manufacturing the semiconductor device according to this embodiment, it is possible to increase the width of the second side wall 43, which is formed on the side wall of the second gate electrode 14 facing the second drain region 46b, in the gate lengthwise direction to be greater than that of the second side wall 43 which is formed on the side of the second gate electrode 14 facing the second source region 46a.

In this way, it is possible to form the end of the second drain region 46b immediately below the second side wall 43, as shown in FIG. 4A. Therefore, it is possible to reliably trap the hot carriers generated at the end of the second drain region 46b below the second side wall 43.

Therefore, it is possible to improve the yield of a semiconductor device that includes a non-volatile memory using the hot carriers trapped below the second side wall 43.

Although the embodiments of the invention have been described above with reference to the drawings, the embodiments of the invention are just illustrative, and the invention may use various structures other than the above.

For example, a plurality of dummy gates 16 may have different lengths in the gate width direction or in the gate length direction.

Each of the first side wall 40 and the second side wall 43 may have a single-layer structure, and they may be made of, for example, $SiO_2$.

Each of the first side wall 40 and the second side wall 43 may have a three-layer structure. In this case, for example, three layers made of $SiO_2$, $SiN$, and $SiO_2$ may be formed on the substrate 10 in this order.

In the first and second embodiments, three or more dummy gates 16 may be formed on the surface of the second gate electrode 14 in side of region to be formed drain in a comb teeth shape integrally with the second gate electrode 14.

It is apparent that the present invention is not limited to the above embodiment, and may be modified and changed without departing from the scope and spirit of the invention.

Meanwhile, the present invention can also be configured as follows.

(a) A semiconductor device comprising:

an FET region that includes a first gate electrode formed over a substrate, first source/drain regions formed in the vicinity of the surface of said substrate on both sides of said first gate electrode, and a first side wall formed over the side of said first gate electrode; and a non-volatile memory region that includes a second gate electrode formed over said substrate, a plurality of dummy gates provided in a comb teeth shape on a drain forming region side of said second gate electrode, second source/drain regions formed on both sides of said second gate electrode in the vicinity of the surface of said substrate, and a second side wall provided over the side of said second gate electrode, wherein said etching said insulating film contains obtaining said second side wall in which the wide of said second side wall formed over the side wall of said second gate electrode not facing said dummy gates on said drain forming region side is larger, compared to the wide of said second side wall formed over the side wall of said second gate electrode on a source forming region side, in the gate length direction.

(b) The semiconductor device as set forth in (a),
wherein said dummy gates are spaced from each other in a gate width direction with a distance z represented by the following expression therebetween:

$$1.5x < z \leq 2.5x$$

wherein x indicates the length of said second side wall formed on said source forming region side of said second gate electrode in the gate length direction.

(c) The semiconductor device as set forth in (a),
wherein said plurality of dummy gates are spaced from said second gate electrode on surface in the side of a drain region.

(d) The semiconductor device as set forth in (a)-(c),
wherein said second side wall includes a nitride film.

What is claimed is:

1. A method of manufacturing a semiconductor device, comprising:
    forming an FET forming region including a first gate electrode and a non-volatile memory forming region including a second gate electrode and a plurality of dummy gates provided in a comb teeth shape on a drain forming region side of said second gate electrode over a substrate;
    forming a resist film that covers said non-volatile memory forming region;
    implanting impurities into said substrate of said FET forming region, using said resist film and said first gate electrode as a mask, to form a pair of extension regions on both sides of said first gate electrode in the vicinity of the surface of said substrate;
    removing said resist film and forming an insulating film so as to cover said FET forming region and said non-volatile memory forming region; and
    etching said insulating film to obtain a first side wall formed over the side of said first gate electrode and a second side wall formed over the sides of said second gate electrode and said dummy gates,
    wherein said etching said insulating film contains obtaining said second side wall in which the width of said second side wall formed over the side wall of said second gate electrode not facing said dummy gates on said drain forming region side is larger, compared to the width of said second side wall formed over the side wall of said second gate electrode on a source forming region side, in the gate length direction.

2. The method of manufacturing a semiconductor device as set forth in claim 1, further comprising:
    after said etching said insulating film,
    implanting impurities, using said first gate electrode and said first side wall, and said second gate electrode, said dummy gates, and said second side wall as a mask, to form a pair of first source/drain regions on both sides of said first side wall in the vicinity of the surface of said substrate, and a pair of second source/drain regions on both sides of said second side wall and said dummy gates in the vicinity of the surface of said substrate; and
    performing annealing to activate the impurities in said first source/drain regions and said second source/drain regions.

3. The method of manufacturing a semiconductor device as set forth in claim 1, wherein said dummy gates are spaced from each other in a gate width direction with a distance z represented by the following expression therebetween:

$$5x < z \leq 2.5x$$

wherein x indicates the length of said second side wall formed on said source forming region side of said second gate electrode in the gate length direction.

4. The method of manufacturing a semiconductor device as set forth in claim 1, wherein said plurality of dummy gates are spaced from said second gate electrode on surface in the side of region to be formed a drain.

5. The method of manufacturing a semiconductor device as set forth in claim 1, wherein said insulating film includes a nitride film.

* * * * *